Figure 1:
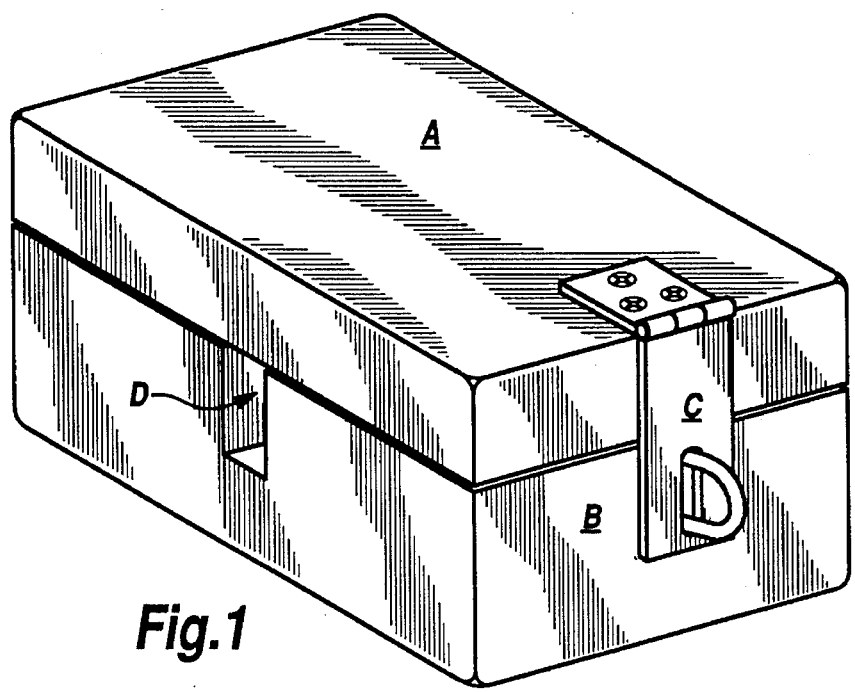
Figure 2:
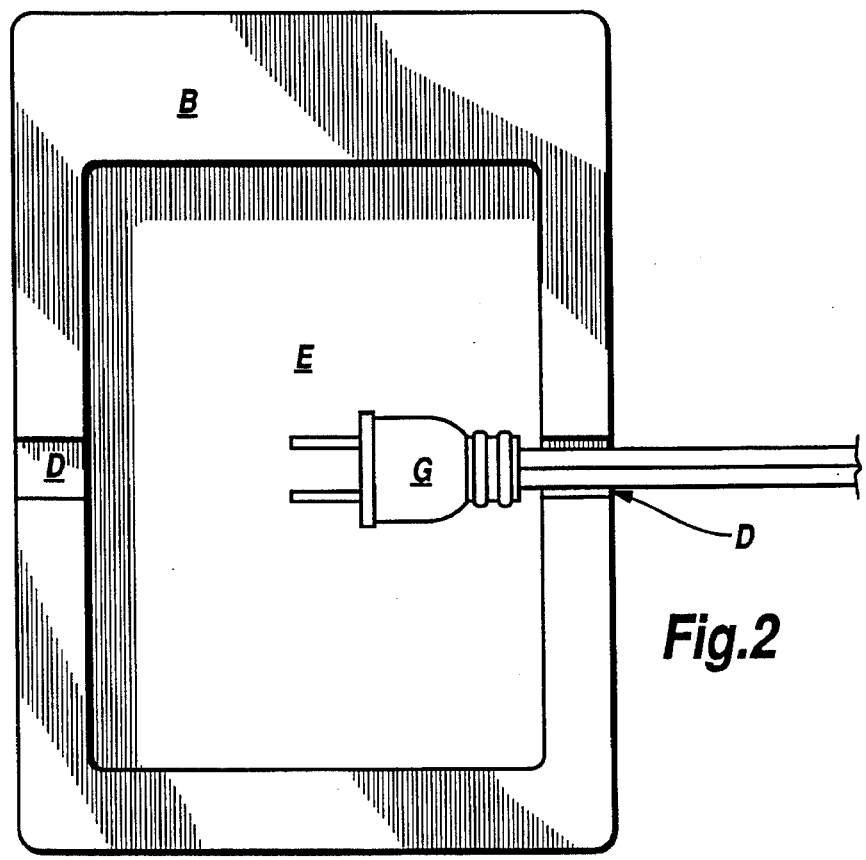
Figure 3:
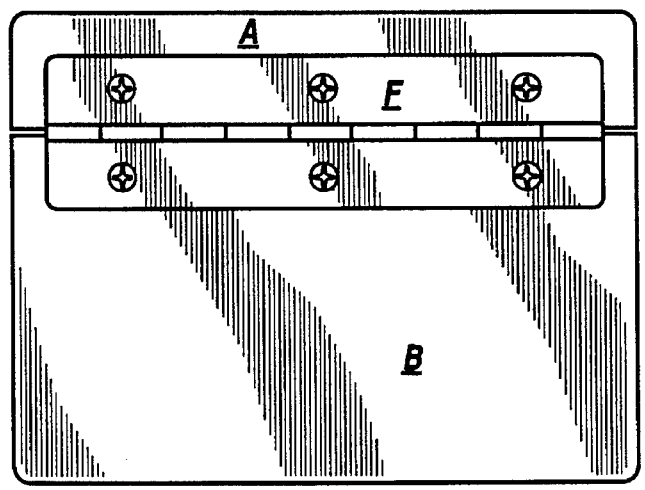
Figure 4:
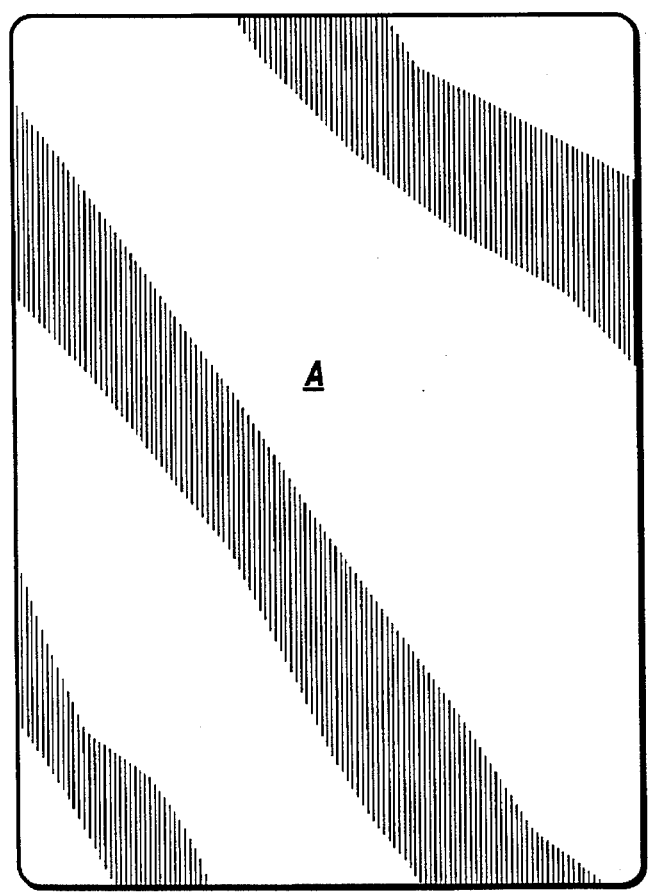

United States Patent [19]
Ali et al.

[11] Patent Number: 5,566,847
[45] Date of Patent: Oct. 22, 1996

[54] ELECTRONIC PLUG BOX

[76] Inventors: Debra R. Ali, P.O. Box 5605, Savannah, Ga. 31414; John B. Collier, Jr., 521 E. 40 St., Savannah, Ga. 31401

[21] Appl. No.: 16,280

[22] Filed: Feb. 11, 1993

[51] Int. Cl.⁶ .................................................. B65D 43/00
[52] U.S. Cl. ................................. 217/57; 220/3.8
[58] Field of Search .......................... 217/57; 220/3.8, 220/4.02

[56] References Cited

U.S. PATENT DOCUMENTS

| | | | |
|---|---|---|---|
| 461,195 | 10/1891 | Dillon | 220/3.8 X |
| 1,070,194 | 8/1913 | Shine | 217/57 |
| 2,643,787 | 6/1953 | Rockman | 220/3.8 X |
| 3,093,263 | 6/1963 | Mabry | 220/3.8 X |
| 3,945,530 | 3/1976 | Bozich | 220/3.8 X |
| 4,484,692 | 11/1984 | Palermo et al. | 220/3.8 X |
| 4,979,634 | 12/1990 | Begley | 220/3.8 X |

*Primary Examiner*—Steven M. Pollard
*Attorney, Agent, or Firm*—Willard M. Hanger

[57] ABSTRACT

The Electronic Plug Box is an item designed to "free" a person from the constant monitoring of an electronic device (TV, Video Game, Home Computer, etc.) that is being used by others without that person's permission. The plug box allows an electric plug to be locked so that the electronic device is unusable to children or other persons. The plug box makes it unnecessary for the owner to be present or near the equipment to prevent it's use.

5 Claims, 2 Drawing Sheets

ELECTRONIC PLUG BOX

The Electronic Plug Box is a sturdy wood box designed to prevent unpremitted/unsupervised use of an electronic device by children or other persons when desired. The plug box allows the plug portion of the electronic device to be locked inside of a box when a combination or pad lock is attached to the hasp. The plug box has two sections (upper and lower) which are connected by a hasp and a hinge. The box has two slots—one on each side of the lower box section. One slot allows an electric plug to be placed and locked inside of the box without compression of the electric cord. The box has two slots to allow the box to remain attached to the electric cord when it is not being used to secure the plug—this prevents the box from being misplaced in between use.

DESCRIPTIVE VIEWS OF THE ELECTRONIC PLUG BOX DRAWINGS

View 1: Illustrates overall views of the electronic plug box. The plug box is made of wood and has to sections—upper (Labeled "A") and lower (labeled "B"). The outer dimensions of the box measure: 6 in long, 3½-inch wide and 2¼-inch in hieght. The upper and lower sections of the box are connected by a hasp closure (labeled "C") in the front of the box. The slots (labeled "D") are located on each side of the lower box section. The slots allow an electric cord to pass thru the box when the box is closed. The slots are small enough (½ in. deep and ⅜ in. wide) to prevent the electronic plug from being removed, from inside the box, when the box is closed and locked.

View 2: Illustrates the inside of the lower box section (labeled "E"). The hollowed out inner dimensions of the lower box (E) are: 2½-inch wide, 3½-inch long, and 1¼-inch in depth. This view also illustrates how an electric plug (labeled "G") would be placed inside the box to "lock-up" the plug. The slots (D), on each side of the lower box section, are directly across from one another and allow the box to remain attached to the cord in between use.

View 3: Illustrates the back view of the electric plug box with hinge (labeled "F") connection.

View 4: Illustrates the inside view of the top section (A) of the plug box—it has no hollowed out areas or slots.

DESCRIPTION OF ELECTRONIC PLUG BOX

The electronic plug box is made of two wood sections, that are 6-inches long, a hasp and a hinge. The top section of the box is made with a piece of wood 6-inches long and 3½-inch wide and ¾-inches in height. The bottom section of the box is made with a piece of wood 6-inches long, 3½-inch wide and 1½-inches in height. The bottom section of the wood block is then hollowed out with inner dimensions measuring 2½-inch wide, 3½-inch long and 1¼-inch in depth. Two slots are also cut into each side of the lower section of the box (dimensions ½-inch deep and ⅜-inch wide) directly across from one another. After finishing the wood work, the two sections of the box are then connected with a hinge and hasp. The box is then ready to be used—the combination or pad lock, necessary to lock the box, must be purchased in addition to the box.

We claim:

1. A vault box for controlling access of an electrical outlet plug connected to an electrical appliance cord comprising:

a plug retaining hollow lower section having a transversely extending bottom portion around the perimeter of which an annular sidewall portion extends upwardly terminating in an upper edge surface defining the perimeter of an open top portion of said lower section, a top cover section configured to overlie said lower section open top portion and said sidewall upper edge surface, said lower section sidewall portion having a pair of remotely located slots each extending downwardly from said upper edge surface, each said slot having a width dimension greater than the diameter of said cord and less than the minimal cross sectional dimension of said plug, said remote location of said slots being a separation such that said appliance cord can extend through both said slots with said plug located exteriorly of said lower section, means movably interconnecting said lower and top cover sections for movement between an open position with said top cover section spaced from said sidewall portion upper edge surface and a closed position with said top cover section overlying said sidewall open top portion and upper edge surface and lock attaching means affixed exteriorly of each said section and adapted for engagement by a lock for locking said sections in said closed position.

2. The vault box of claim 1 wherein said annular sidewall portion includes a pair of oppositely located wall portions and each said slot is located in a separate one of said oppositely located wall portion pairs.

3. The vault box of claim 2 wherein said slots are oppositely located in linear alignment.

4. The vault box of claim 3 wherein said interconnecting means comprises hinge means affixed to said top cover section and to a hinge carrying wall of said annular sidewall portion extending between said pair of oppositely located wall portions.

5. The vault box of claim 4 wherein said lock attaching means has segments mounted respectively on a wall portion of said annular sidewall portion extending between said pair of oppositely located wall portions opposite said hinge carrying wall portion and on said top cover portion.

* * * * *